United States Patent
Yang et al.

(10) Patent No.: US 10,199,295 B2
(45) Date of Patent: Feb. 5, 2019

(54) DISPLAY PANEL AND METHOD FOR FORMING THE SAME

(71) Applicants: BOE TECHNOLOGY GROUP CO., LTD., Beijing (CN); ORDOS YUANSHENG OPTOELECTRONICS CO., LTD., Inner Mongolia Autonomous Region (CN)

(72) Inventors: Fan Yang, Beijing (CN); Kun Guo, Beijing (CN); Yuqing Yang, Beijing (CN); Qi Liu, Beijing (CN); Bo Zhang, Beijing (CN); Fei Chen, Beijing (CN); Tianyi Cheng, Beijing (CN); Zihua Li, Beijing (CN); Yan Wu, Beijing (CN); Jin Yang, Beijing (CN); Liman Peng, Beijing (CN); Chao Kong, Beijing (CN)

(73) Assignees: BOE TECHNOLOGY GROUP CO., LTD. (CN); ORDOS YUANSHENG OPTOELECTRONICS CO., LTD. (CN)

( * ) Notice: Subject to any disclaimer, the term of this patent is extended or adjusted under 35 U.S.C. 154(b) by 0 days.

(21) Appl. No.: 15/321,172

(22) PCT Filed: Feb. 1, 2016

(86) PCT No.: PCT/CN2016/073039
§ 371 (c)(1),
(2) Date: Dec. 21, 2016

(87) PCT Pub. No.: WO2017/036089
PCT Pub. Date: Mar. 9, 2017

(65) Prior Publication Data
US 2017/0194224 A1    Jul. 6, 2017

(30) Foreign Application Priority Data
Aug. 31, 2015    (CN) .......................... 2015 1 0548248

(51) Int. Cl.
*H01L 23/29* (2006.01)
*H01L 23/08* (2006.01)
(Continued)

(52) U.S. Cl.
CPC ............ *H01L 23/08* (2013.01); *G02F 1/1339* (2013.01); *G02F 1/13452* (2013.01);
(Continued)

(58) Field of Classification Search
CPC ............... G02F 1/1339; G02F 1/13392; G02F 1/13394; H01L 23/08; H01L 23/053; H01L 23/13; H01L 23/15; H01L 23/24
(Continued)

(56) References Cited

U.S. PATENT DOCUMENTS 5,606,194 A * 2/1997 Lebrun .................. G02F 1/1339
257/432
6,011,607 A * 1/2000 Yamazaki ........... G02F 1/13454
349/151
(Continued)

FOREIGN PATENT DOCUMENTS

CN    1892312 A    1/2007
CN    202600314 U    12/2012
(Continued)

OTHER PUBLICATIONS

First Office Action for Chinese Application No. 201510548248.6, dated Jun. 21, 2017, 7 Pages.
(Continued)

*Primary Examiner* — Kevin M Picardat
(74) *Attorney, Agent, or Firm* — Brooks Kushman P.C.

(57) ABSTRACT

A display panel and a method for forming the same are disclosed. The display panel includes a first substrate and a second substrate arranged opposite to each other. An integrated circuit (IC) is arranged at a non-display region of the first substrate, and at least one supporting component is arranged beyond a portion of the non-display region where the IC is arranged. A thickness of the at least one supporting component is larger than a thickness of the IC.

18 Claims, 3 Drawing Sheets

(51) Int. Cl.
*G02F 1/1339* (2006.01)
*H01L 23/053* (2006.01)
*H01L 23/13* (2006.01)
*H01L 23/15* (2006.01)
*H01L 23/24* (2006.01)
*G02F 1/1333* (2006.01)
*G02F 1/1345* (2006.01)
*H01L 51/52* (2006.01)

(52) U.S. Cl.
CPC ...... *G02F 1/133351* (2013.01); *H01L 23/053* (2013.01); *H01L 23/13* (2013.01); *H01L 23/15* (2013.01); *H01L 23/24* (2013.01); *H01L 51/525* (2013.01)

(58) Field of Classification Search
USPC .......................................... 349/155, 156, 157
See application file for complete search history.

(56) References Cited

U.S. PATENT DOCUMENTS

| | | | | |
|---|---|---|---|---|
| 7,023,518 | B1* | 4/2006 | Koyama | G02F 1/136204 |
| | | | | 349/122 |
| 9,165,719 | B2* | 10/2015 | Logunov | C03C 8/08 |
| 9,252,195 | B2* | 2/2016 | Eom | H01L 51/525 |
| 2004/0207789 | A1* | 10/2004 | Hirakata | G02F 1/13454 |
| | | | | 349/130 |
| 2005/0270438 | A1 | 12/2005 | Konuma et al. | |
| 2007/0002257 | A1 | 1/2007 | Oh et al. | |
| 2011/0102727 | A1* | 5/2011 | Hirato | G02F 1/1339 |
| | | | | 349/153 |
| 2016/0274426 | A1 | 9/2016 | Sun | |
| 2016/0357056 | A1 | 12/2016 | Kang | |

FOREIGN PATENT DOCUMENTS

| | | |
|---|---|---|
| CN | 103472629 A | 12/2013 |
| CN | 103995377 A | 8/2014 |
| CN | 104423082 A | 3/2015 |
| CN | 104656293 A | 5/2015 |
| CN | 104834143 A | 8/2015 |
| CN | 105225608 A | 1/2016 |
| JP | 2007329321 A | 12/2007 |

OTHER PUBLICATIONS

International Search Report and Written Opinion for Application No. PCT/CN2016/073039, dated May 27, 2016, 12 Pages.

* cited by examiner

|    |    |    |    |    |    |    |    |    |    |
|----|----|----|----|----|----|----|----|----|----|
| AA | AB | AC | AD | AE | AF | AG | AH | AI | AJ |
| BA |    |    |    |    |    |    |    |    |    |
| CA |    |    |    |    |    |    |    |    |    |
| DA |    |    |    |    |    |    |    |    |    |
| EA |    |    |    |    |    |    |    |    |    |

DISPLAY PANEL AND METHOD FOR FORMING THE SAME

CROSS-REFERENCE TO RELATED APPLICATIONS

This application is the U.S. national phase of PCT Application No. PCT/CN2016/073039 filed on Feb. 1, 2016, which claims priority to Chinese Patent Application No. 201510548248.6 filed on Aug. 31, 2015, the disclosures of which are incorporated in their entirety by reference herein.

TECHNICAL FIELD

The present disclosure relates to the field of display technology, and in particular to a display panel and a method for forming the same.

BACKGROUND

The POST process is to cut a whole piece of glass (Q-Glass) into a plurality of small pieces of glass (panels). Referring to FIG. 1, a schematic view of the process of cutting a display panel into sub-display panels according to the related art is shown. As shown in FIG. 1, the Q-Glass is cut into 50 small panels (designated by AA-EK). The Q-Glass is cut into 5 rows (i.e. row A, row B, row C, row D and row E) first. Then, each row is cut into 10 panels. For the row A, panels AA-AJ are obtained and the cover glass corresponding to the dashed block is removed to expose a region corresponding to the Teg of the integrated circuit (IC). Teg inputting and IC inputting are two approaches to providing signals. Teg is the input end for the ET lighting signal which is used to collect yield statistics, and IC is the input end of the (Flexible Printed Circuit) FPC which is attached in a subsequent module process. If the IC on the backplane glass is damaged, the corresponding IC lines would also be scratched. Even if the FPC is attached, circuit defects such as abnormal display, screen splitting, X-Line and Y-Line will occur.

In the POST process in the related art, manual assistances are required. After the Q-Glass is automatically cut into 5 rows, one of the rows needs to be manually taken out from the cutting device and put into the cutting device again so as to be cut into individual panels, and the cover glass corresponding to the dashed block as shown in FIG. 1 is required to be manually removed. Glass debris generated during this manual operation may scratch the IC. At present, there is no other effective way to detect IC scratches except manual detection, and there may be big errors in the manual detection, which leads to low detection success rate.

As a result, how to reduce glass debris during the manual operation so as to reduce the probability of scratches on the IC has become an urgent problem to be solved.

SUMMARY

The present disclosure aims to provide a display panel and a method for forming the same, so as to solve the technical problem of how to reduce glass debris during the manual operation so as to reduce the probability of scratching the IC.

To this end, the present disclosure provides a display panel. The display panel includes a first substrate and a second substrate arranged opposite to each other. An integrated circuit (IC) is arranged at a non-display region of the first substrate, and at least one supporting component is arranged beyond a portion of the non-display region where the IC is arranged. A thickness of the at least one supporting component is larger than a thickness of the IC.

Optionally, the at least one supporting component is a cylinder or cuboid.

Optionally, the at least one supporting component is a cylinder and has a cylinder diameter of 0.2 mm.

Optionally, the display panel includes two supporting components arranged at an edge of the non-display region.

Optionally, a material of the at least one supporting component includes glass cement.

Optionally, a sealant is coated at an edge of a display region of the first substrate.

Optionally, the thickness of the at least one supporting component is identical to a thickness of the sealant.

Optionally, a distance by which the at least one supporting component extends from the first substrate in a first direction is larger than a distance by which the IC extends from the first substrate in the first direction, and the first direction is perpendicular to the first substrate and is oriented from the first substrate to the second substrate.

Optionally, the IC is not in contact with the second substrate.

Optionally, the sealant is glass cement.

The present disclosure further provides a method for forming a display panel. The method includes: forming a first substrate and a second substrate arranged opposite to each other. The step of forming the first substrate includes: forming an integrated circuit (IC) at a non-display region of the first substrate; and forming at least one supporting component beyond a portion of the non-display region where the IC is arranged, where a thickness of the at least one supporting component is larger than a thickness of the IC.

Optionally, the supporting component is glass cement, a sealant is coated onto a display region of the first substrate, the thickness of the at least one supporting component is identical to a thickness of the sealant, and the at least one supporting component and the sealant are formed by one coating process simultaneously.

Optionally, the sealant is glass cement.

Optionally, the method further includes: hardening the coated sealant by laser.

Compared with the prior art, according to the display panel and the method for forming the same provided by the present disclosure, the probability of scratching the IC by glass debris generated during the operation of manually removing the second substrate above the IC, and the adverse influence on the subsequent module process may be reduced, so as to reduce the defective rate caused by abnormal display after the module process.

DETAILED DESCRIPTION

The technical solutions of the embodiments of the present disclosure will be described hereinafter in a clear and complete manner in conjunction with the drawings. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

To solve the problem that the IC at the non-display region of the panel may be scratched when the IC side glass is peeled off manually in the POST process, the present disclosure provides a method of dispensing Frit cement (glass cement) at opposite sides of the IC, so as to form a space between the encapsulating glass and the backplane glass, which spaces the IC apart from the other structures at the top and the sides thereof, thereby reducing the possibility of scratching the IC during peeling off the glass in the POST process.

To this end, the present disclosure provides in some embodiments a display panel which is capable of being cut into a plurality of sub-display panels.

Figures 1, 2:
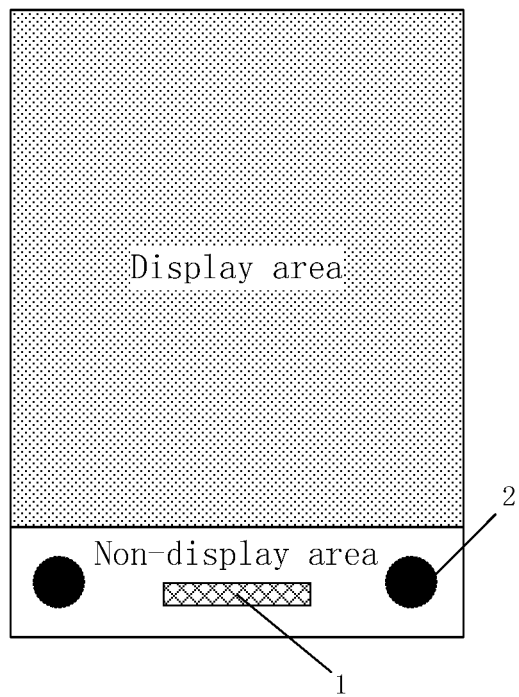
FIG. 1 is a schematic view of a process of cutting a display panel into sub-display panels according to the related art.
FIG. 2 is a top view of a sub-display panel cut from a display panel and provided with supporting components according to some embodiments of the present disclosure.
Figure 3:
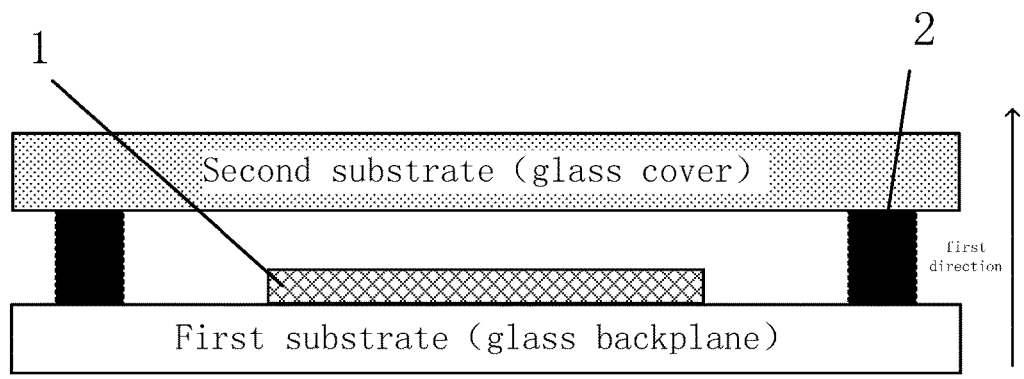
FIG. 3 is a side view of a sub-display panel cut from a display panel and provided with supporting components according to some embodiments of the present disclosure.

For ease of understanding, reference is made to both FIGS. 2 and 3 (FIG. 2 is a top view of a sub-display panel cut from a display panel and provided with supporting components according to some embodiments of the present disclosure, and FIG. 3 is a side view of a sub-display panel cut from a display panel and provided with supporting components according to some embodiments of the present disclosure).

The above-mentioned display panel includes a first substrate and a second substrate arranged opposite to each other. An IC 1 is arranged at a non-display region of the first substrate. Supporting components 2 are arranged beyond the portion provided with the IC 1, and a thickness of each of the supporting components 2 is larger than higher than a thickness of the IC 1.

In this display panel, since the supporting components 2 are arranged beyond the portion provided with the IC 1, the supporting components 2 may provide effective supporting and buffering when manually removing the second substrate (cover plate) above the IC 1. Therefore, the possibility of scratching the IC 1 by glass debris generated during the removing of the cover plate is reduced, thereby protecting the IC.

In some embodiments of the present disclosure, the supporting components 2 may be a cylinder or cuboid. These shapes are common and conform to the design requirements of the substrate attaching process. Apparently, in practical implementations, any other proper shape may be employed as long as the designed supporting components 2 do not affect adversely the IC 1 or signal lines around the IC 1.

In practical implementations, the supporting components 2 are preferably a cylinder, since a cylindrical component occupies less space and provides enough supporting forces to meet the substrate attaching requirements, and may be flexibly arranged.

In some embodiments of the present disclosure, the supporting components 2 are designed to be a cylinder with a 0.2 mm diameter. In respect of the plurality of sub-display panels cut from the above-mentioned display panel, each of the sub-display panels has a small non-display region. The IC 1 occupies a certain portion of the non-display region, and thus no supporting component is arranged at the non-display region in order not to affect the operation of the IC 1. Although the cylindrical supporting component which occupies a small area and provides a sufficient supporting force is employed, it is still necessary to restrict the bottom area of the cylindrical supporting component. The value of 0.2 mm is chose based on the practical processes. Bottom diameters of the cylindrical supporting component smaller than 0.2 may also be used as long as the supporting forces meet the design requirements, and the embodiments of the present disclosure is not limited herein.

When the supporting component is designed to be a cylinder, the number of the supporting components 2 is two, and the two supporting components 2 are arranged at the edge of the non-display region. As such, it is able to make the supporting component to occupy a small space and provide a balanced and effective supporting.

In some embodiments of the present disclosure, the supporting components 2 are made of glass cement. The glass cement is the commonly used adhesive material in the substrate attaching process. The glass cement has a good adhesiveness when coated and strong roughness after hardened. Due to these advantages, the supporting components 2 may be formed by coating the glass cement, thereby simplifying the process of forming the supporting components 2.

Figure 5:
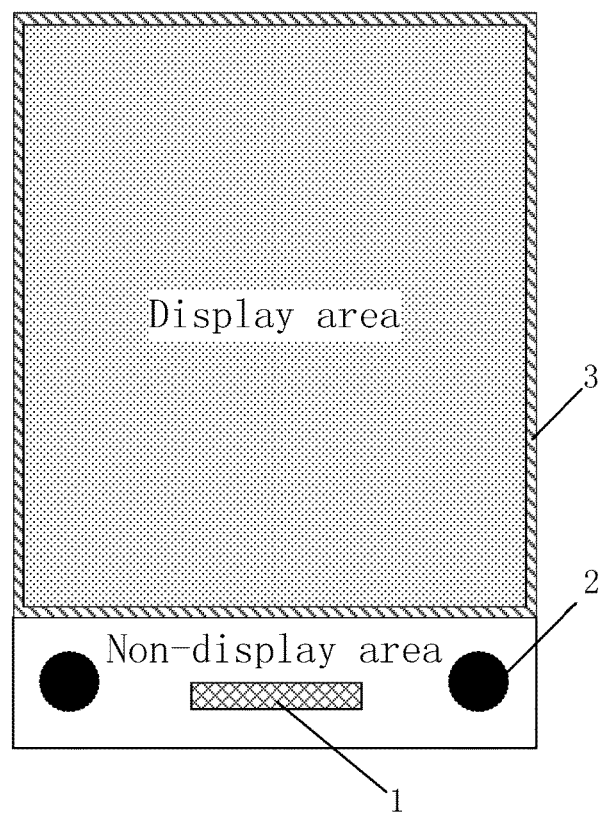
FIG. 5 is a top view of a sub-display panel cut from a display panel and provided with supporting components and a sealant according to some embodiments of the present disclosure.
Figure 6:
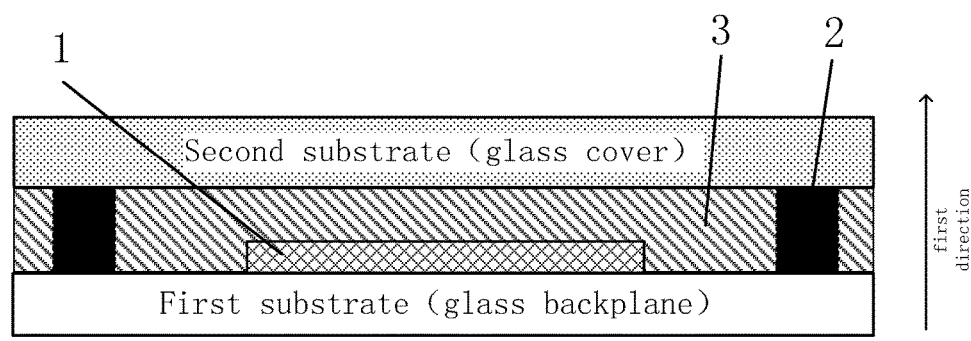
FIG. 6 is a side view of a sub-display panel cut from a display panel and provided with supporting components and a sealant according to some embodiments of the present disclosure.

In some embodiments of the present disclosure, a frame-like sealant 3 is coated at the edge of the display region of the first substrate. For example, in some embodiments, the sealant 3 may be arranged as shown in FIGS. 5 and 6. It is well known that for the first substrate which is used as the backplane, the display region of the first substrate is required to meet the requirements of cutting into a plurality of sub-display panels before the cutting process, and each of the sub-display panels necessarily has a display region (also referred to as a sub-display region for ease of description). That is, the entire display region of the first substrate includes a plurality of sub-display regions, and then it is required to arrange a component for sealing at the edge of each sub-display region. In practice processes, the above-mentioned sealant 3 is commonly used. In practical implementations, the above-mentioned sealant 3 is usually made of glass cement which is identical to that of the supporting components 2.

In some embodiments of the present disclosure, the thickness of each supporting component 2 is identical to a thickness of the sealant 3. Apparently, this design has numerous advantages. Since the supporting components 2 and the sealant 3 are made of the same material (e.g. the glass cement), the supporting components 2 and the sealant 3 are simultaneously formed by one process so that the supporting components 2 and the sealant 3 have the same thickness.

In respect of the above-mentioned display panel, of the present disclosure further provides in some embodiments a method for forming a display panel. The display panel manufactured by this method is capable of being cut into a plurality of sub-display panels. The method for forming the display panel includes: forming a first substrate and a second substrate arranged opposite to each other. The step of forming the first substrate will be described hereinafter in conjunction with FIG. 4.

Figure 4:
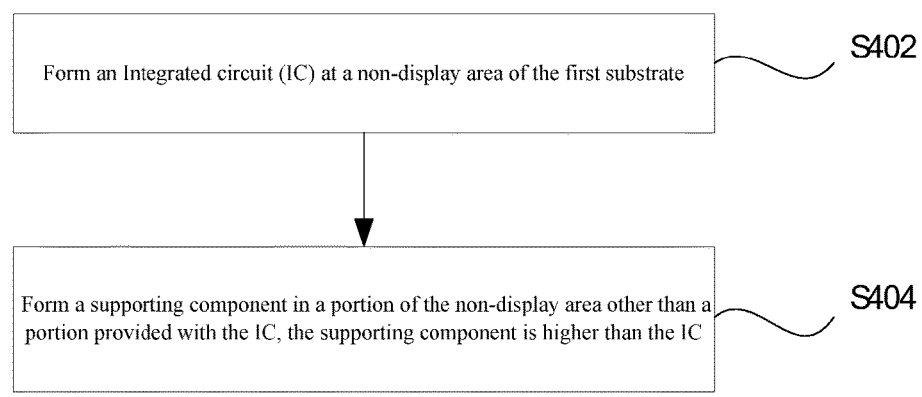
FIG. 4 is a flow chart of a method for forming a display panel according to some embodiments of the present disclosure.

FIG. 4 is a flow chart of a method for forming a display panel according to some embodiments of the present disclosure. As shown in FIG. 4, the step of forming the first substrate includes the following steps (steps S402-S404):

Step S402, forming an IC at a non-display region of the first substrate.

Step S404, forming a supporting component beyond a portion of the non-display region provided with the IC. A thickness of the supporting component is larger than a thickness of the IC.

In the method of forming the display panel, the supporting component may be formed by coating glass cement, or the supporting component may be formed by coating a sealant at the non-display region of the first substrate while coating the sealant at the display region of the first substrate. Certainly, the supporting component and the sealant are formed by one coating process simultaneously. As such, the supporting component and the sealant may have an identical thickness. It should be noted that, the sealant coated at the display region of the first substrate needs to be hardened by laser, while the sealant forming the supporting component does not.

In practical processes, the cement may be dispensed in the following manner: forming two holes each of a 0.2 mm diameter at predetermined positions (for example, positions corresponding to the Teg) on a metallic screen for printing glass cement, and dispensing the glass cement at the positions of the two holes while printing the glass cement to form a sealant. Then the backplane glass is attached with an encapsulating glass to form a big panel (i.e., the entire display panel), and then the big panel is cut into small panels (i.e. the above-mentioned sub-display panels) by the POST process. Since the encapsulating glass and the backplane glass are supported by the glass cement (i.e., the Frit cement) arranged therebetween and the glass cement coated at the non-display region is not hardened by laser, the glass cement coated at the non-display region may sever as a rubber pad, so that it is less difficult to peel off the encapsulating glass above the non-display region, thereby protecting the IC from being scratched and increasing the yield of the entire backlight module.

The above are merely the preferred embodiments of the present disclosure. A person skilled in the art may make further modifications and improvements without departing from the principle of the present disclosure, and these modifications and improvements shall also fall within the scope of the present disclosure.

What is claimed is:

1. A display panel, comprising a first substrate and a second substrate arranged opposite to each other, wherein
an integrated circuit (IC) is arranged at a non-display region of the first substrate,
at least one supporting component is arranged beyond a portion of the non-display region where the IC is arranged, and a thickness of the at least one supporting component is larger than a thickness of the IC;
wherein a sealant is coated at an edge of a display region of the first substrate, and the supporting component is made of a material identical to the sealant;
the thickness of the supporting component is identical to an interval between the first substrate and the second substrate at the display region, and an orthographic projection of the supporting component onto the first substrate is outside an orthographic projection of the sealant onto the first substrate and an orthographic projection of the display region enclosed by the sealant onto the first substrate;
the supporting component is a cuboid.

2. The display panel according to claim 1, wherein the display panel comprises two supporting components arranged at an edge of the non-display region.

3. The display panel according to claim 1, wherein the material comprises glass cement.

4. The display panel according to claim 1, wherein the thickness of the at least one supporting component is identical to a thickness of the sealant.

5. The display panel according to claim 1, wherein a distance by which the at least one supporting component extends from the first substrate in a first direction is larger than a distance by which the IC extends from the first substrate in the first direction, and
the first direction is perpendicular to the first substrate and is oriented from the first substrate to the second substrate.

6. The display panel according to claim 1, wherein the IC is not in contact with the second substrate.

7. The display panel according to claim 1, wherein the sealant is glass cement.

8. A method for forming a display panel, comprising steps of: forming a first substrate and a second substrate arranged opposite to each other, wherein
the step of forming the first substrate comprises:
forming an integrated circuit (IC) at a non-display region of the first substrate; and
forming at least one supporting component beyond a portion of the non-display region where the IC is arranged, wherein a thickness of the at least one supporting component is larger than a thickness of the IC;
wherein a sealant is coated at an edge of a display region of the first substrate, and the at least one supporting component is made of a material identical to the sealant;
the thickness of the supporting component is identical to an interval between the first substrate and the second substrate at the display region, and an orthographic projection of the supporting component onto the first substrate is outside an orthographic projection of the sealant onto the first substrate and an orthographic projection of the display region enclosed by the sealant onto the first substrate;
the supporting component is a cuboid.

9. The method according to claim 8, wherein
the at least one supporting component is glass cement,
the thickness of the at least one supporting component is identical to a thickness of the sealant, and the at least one supporting component and the sealant are formed by one coating process simultaneously.

10. The method according to claim 9, wherein the sealant is glass cement.

11. The method according to claim 10, further comprising hardening the coated sealant by laser.

12. A display panel comprising:
a first substrate having a non-display region;
a second substrate disposed opposite the first substrate by a first distance;
an integrated circuit (IC) disposed at the non-display region of the first substrate;

a supporting component disposed beyond a portion of the non-display region where the IC is arranged, and the supporting component having a thickness larger than a thickness of the IC; and a sealant is coated at an edge of a display region of the first substrate, the supporting component and the sealant being made of the same material;

the thickness of the supporting component is the same as the first distance at the display region, and an orthographic projection of the supporting component onto the first substrate is outside an orthographic projection of the sealant onto the first substrate and an orthographic projection of the display region enclosed by the sealant onto the first substrate; and the supporting component is a cuboid.

13. The display panel according to claim 12, wherein the display panel comprises two supporting components arranged at an edge of the non-display region.

14. The display panel according to claim 12, wherein the material comprises glass cement.

15. The display panel according to claim 12, wherein the supporting component and the sealant have the same thickness.

16. The display panel according to claim 12, wherein a distance by which the supporting component extends from the first substrate in a first direction is larger than a distance by which the IC extends from the first substrate in the first direction, and the first direction is perpendicular to the first substrate and is oriented from the first substrate to the second substrate.

17. The display panel according to claim 12, wherein the IC is not in contact with the second substrate.

18. The display panel according to claim 12, wherein the sealant is glass cement.

* * * * *